(12) United States Patent
Kessler

(10) Patent No.: US 7,465,886 B1
(45) Date of Patent: Dec. 16, 2008

(54) SPHERIC ALIGNMENT MECHANISM ENTROPIC STEP DOWN AND PROPULSION SYSTEM

(76) Inventor: Stephen Burns Kessler, 639 W. Rose Hill, Kirkwood, MO (US) 63122

( * ) Notice: Subject to any disclaimer, the term of this patent is extended or adjusted under 35 U.S.C. 154(b) by 315 days.

(21) Appl. No.: 11/192,610

(22) Filed: Jul. 29, 2005

Related U.S. Application Data

(63) Continuation-in-part of application No. 11/108,424, filed on Apr. 18, 2005.

(51) Int. Cl.
*H05K 9/00* (2006.01)
(52) U.S. Cl. .............. 174/377; 174/125.1; 505/236
(58) Field of Classification Search ............... 335/216; 174/377, 125.1; 505/236
See application file for complete search history.

(56) References Cited

U.S. PATENT DOCUMENTS

| | | | |
|---|---|---|---|
| 4,874,346 A | 10/1989 | Wachspress | |
| 5,204,568 A * | 4/1993 | Kleinberg et al. | 310/90.5 |
| 5,267,091 A | 11/1993 | Chen | |
| 5,430,009 A | 7/1995 | Wang | |
| 5,590,031 A | 12/1996 | Mead, Jr. et al. | |
| 5,831,362 A | 11/1998 | Chu et al. | |
| 5,841,211 A | 11/1998 | Boyes | |
| 5,966,452 A | 10/1999 | Norris | |
| 6,024,935 A | 2/2000 | Mills et al. | |
| 6,193,194 B1 | 2/2001 | Minovitch | |
| 6,318,666 B1 | 11/2001 | Brotz | |
| 6,960,975 B1 | 11/2005 | Volfson | |
| 7,150,089 B2 * | 12/2006 | Scafidi | 29/463 |
| 2004/0239119 A1 * | 12/2004 | Pinkerton et al. | 290/1 R |
| 2007/0237279 A1 * | 10/2007 | Cheang | 376/100 |

OTHER PUBLICATIONS

J.A. Peacock, Excerpt form, Large-scale surveys and cosmic structure, Institute for Astronomy, University of Edinburgh UK,arXiv:astro-ph/0309240 v3 Nov. 24, 2003.
The Force Of Acoustics, PhysicsWeb Dec. 4, 1998.
Arthur Kosowsky Seeing Sound Waves in the Early Universe Department of Physics and Astronomy, Rutgers University, arXiv:astro-ph/9811163 v1 Nov. 10, 1998.
C. E. Aguiar, E. S. Fraga, and T. Kodama, Spinodal Instability, no date.

(Continued)

*Primary Examiner*—Hung V Ngo
(74) *Attorney, Agent, or Firm*—Dennis J. M. Donahue, III; Husch Blackwell Sanders LLP

(57) ABSTRACT

A chamber or series of chambers for manipulating a work product is formed in layers as a series of nested shells. The shells have an outer structural casing and an electromagnetic shield that surrounds a superconducting shell. The superconducting shell is either room temperature or immersed in a cryogenic coolant contained in a reservoir. The work product is further manipulated using kinetic energy to move it through electromagnetic field amplifiers to facilitate energy release for power generation or motive propulsion.

22 Claims, 11 Drawing Sheets

OTHER PUBLICATIONS

M. D. Roberts, Vacuum Energy, Wimbledon, London http://cosmology.mth.uct.ac.za/"<roberts arXiv:hep-th/0012062 v3 Jul. 22, 2001 pp. 74 ¶ 6).

G. F. Edelmann, An Overview of Time-Reversal Acoustic Communications, U.S. Naval Research Laboratory, no date.

D. Cassereau, M. Fink, The phased array technology-application to time-reversal in acoustics, Laboratoire Ondes et Acoustique, France, IEEE, no date.

K. P. Singh, V. L. Gupta, Lalita Bhasin and V. K. Tripathi, Electron acceleration by a plasma wave in a sheared magnetic field 2003 Physics Of Plasma, vol. 10, No. 5 May 200.

S. You, G. Yun, P. M. Bellan, Dynamic and Stagnating Plasma Flow Leading to Magnetic Flux Tube Collimation, California Institute of Technology, Jun. 29, 2005 arXiv:physics/050.

M Scandurra, QFT Limit of the Casimir Force, MIT Center for Theoretical Physics; asXiv:hep-th/030607v2; Jul. 14, 2003.

U.S. Appl. No. 10/998,401, Volfson.

Dec. 10, 2007 Notification of Transmittal of The International Search Report and The Written Opinion of the Internaitonal Searching Authority, or the Declaration.

* cited by examiner

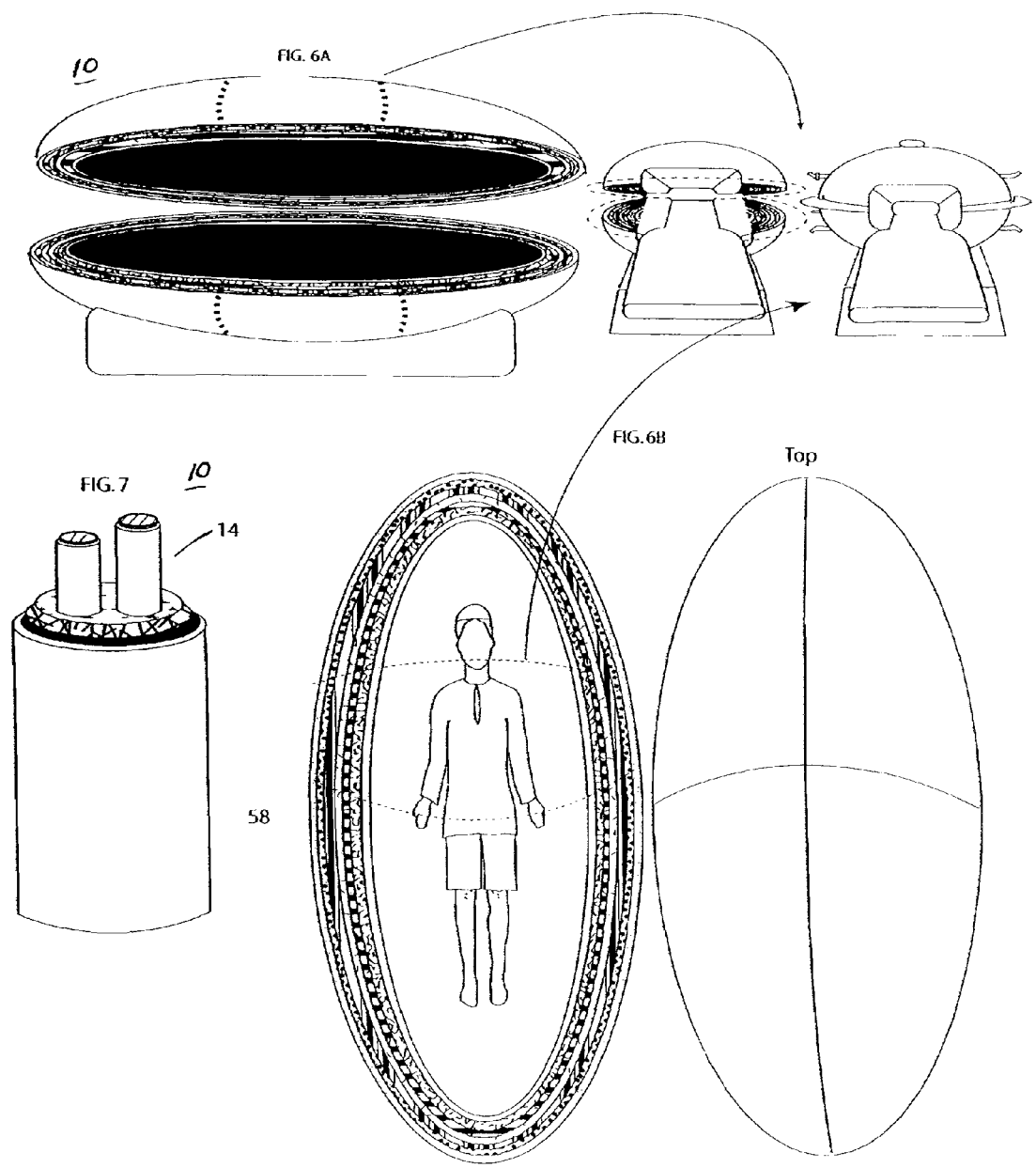

SAM ESD Generator/Engine
View Aerial Down

FIG. 14 b Schematic

SAM ESD Generator/Engine Partial Side Elevation

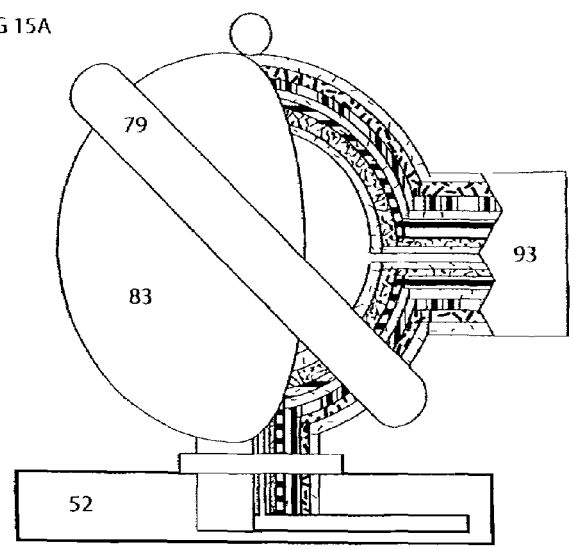
FIG 15A
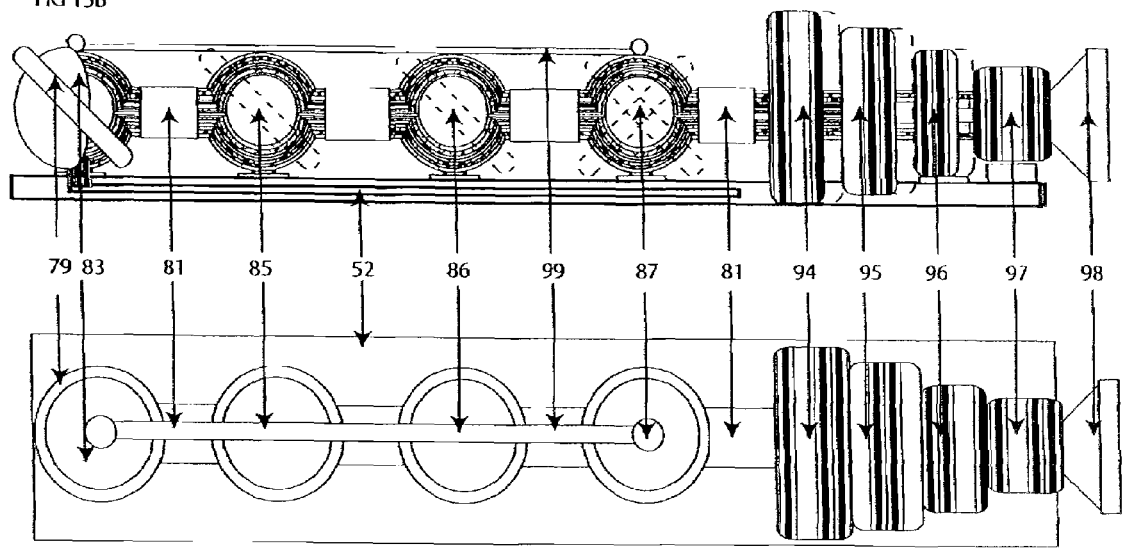
FIG 15B
FIG 15C

79 from 86 to 94

SAM EPS Close

52

Chamber 87 Alternate Interior
Wave Cancellation
Apparatus Schematic

Bridge from 86 to 94 a. Plasma wave Holding chamber
b. Variable 180° Phase Holding Chamber
c. Innermix chamber
d. distribution compartment

SPHERIC ALIGNMENT MECHANISM ENTROPIC STEP DOWN AND PROPULSION SYSTEM

CROSS-REFERENCE TO RELATED APPLICATIONS

This application claims the benefit of U.S. Provisional Application No. 60/592,614 filed on Jul. 30, 2004, the disclosure of which is incorporated herein by reference. This application is a continuation-in-part of U.S. application Ser. No. 11/108,424, filed on Apr. 18, 2005.

BACKGROUND OF THE INVENTION

1. Field of the Invention

The present invention relates to superconductive materials, and more particularly, to a superconducting shell(s) with electromagnetic shielding surrounding a work product in an entropically isolated environment with kinetic facilitation of energy generation or propulsion.

2. Related Art

Generally, quantum physics predicts that all of space is filled with zero-point fluctuations, also called the zero-point field, creating a universal sea of zero-point energy. The density of this energy depends critically on where in frequency the zero-point fluctuations cease. Since space itself is thought to break up into a kind of quantum foam at a tiny distance scale called the Planck scale ($10^{-33}$ cm), it is argued that the zero point fluctuations must cease at a corresponding Planck frequency ($10^{43}$ Hz). According to this theory, the zero-point energy density would be 110 orders of magnitude greater than the radiant energy at the center of the sun.

There are numerous patents whose claims use electromagnetic radiation to facilitate conversion of zero point energy into usable electrical energy, such as U.S. Pat. No. 5,590,031. It has also been suggested that a superconducting sphere could be used to interact with an external geomagnetic field to propel a vehicle within the field, such as in U.S. Pat. No. 6,318,666, and that plasma could be phased to interference waves using electromagnetism, such as in U.S. Pat. No. 5,966,452. However, these prior devices fail to disclose or suggest a superconducting shell according to the present invention, which does not interact with external geomagnetic field, or any other ambient magnetic or electrical field, but instead shields the interior of the shell from such fields to use sound as an energy driver. Therefore, these prior devices cannot provide an entropically isolated environment for a work product within such devices.

SUMMARY OF THE INVENTION

Generally, the present invention provides an entropically isolated environment for a work product within a chamber. In particular, the present invention is a chamber formed by a series of nested shells that shield a work product within the chamber from electromagnetic fields from the ambient environment around the chamber, and with at least one shell being superconductive. The superconducting shell can be made of either overlapping individual superconductors or made of a solid superconductor wall. The work product can be manipulated using kinetic energy and electromagnetic energy in one shell or a series of connected shells.

The present invention effects zero point energy on atomic strong/weak force and molecular structures by creating an entropically isolated environment in which ambient electromagnetic fields are minimized during the critical initiating phase of energetic conversion of zero point energy. More particularly, the chamber of the present invention maintains a mixed state of low entropy followed by high entropy and effects atomic and molecular structures of the work product placed within the chamber. Accordingly, the chamber can be used in biophysics/life sciences, electronics, computer science, energy production, propulsion, particle physics, electromagnetism, chemistry, pharmaceuticals and material science.

Further areas of applicability of the present invention will become apparent from the detailed description provided hereinafter. It should be understood that the detailed description and specific examples, while indicating the preferred embodiment of the invention, are intended for illustration only and are not intended to limit the scope of the invention.

BRIEF DESCRIPTION OF THE DRAWINGS

The present invention will become more fully understood from the detailed description and the accompanying drawings, wherein:

FIGS. 6A and 6B illustrate an alternative embodiment of the present invention;

FIG. 7 illustrates an alternative embodiment of the present invention;

FIG. 15 illustrates an alternate embodiment of the present invention called EPS.

DETAILED DESCRIPTION OF THE PREFERRED EMBODIMENTS

Figure 1:
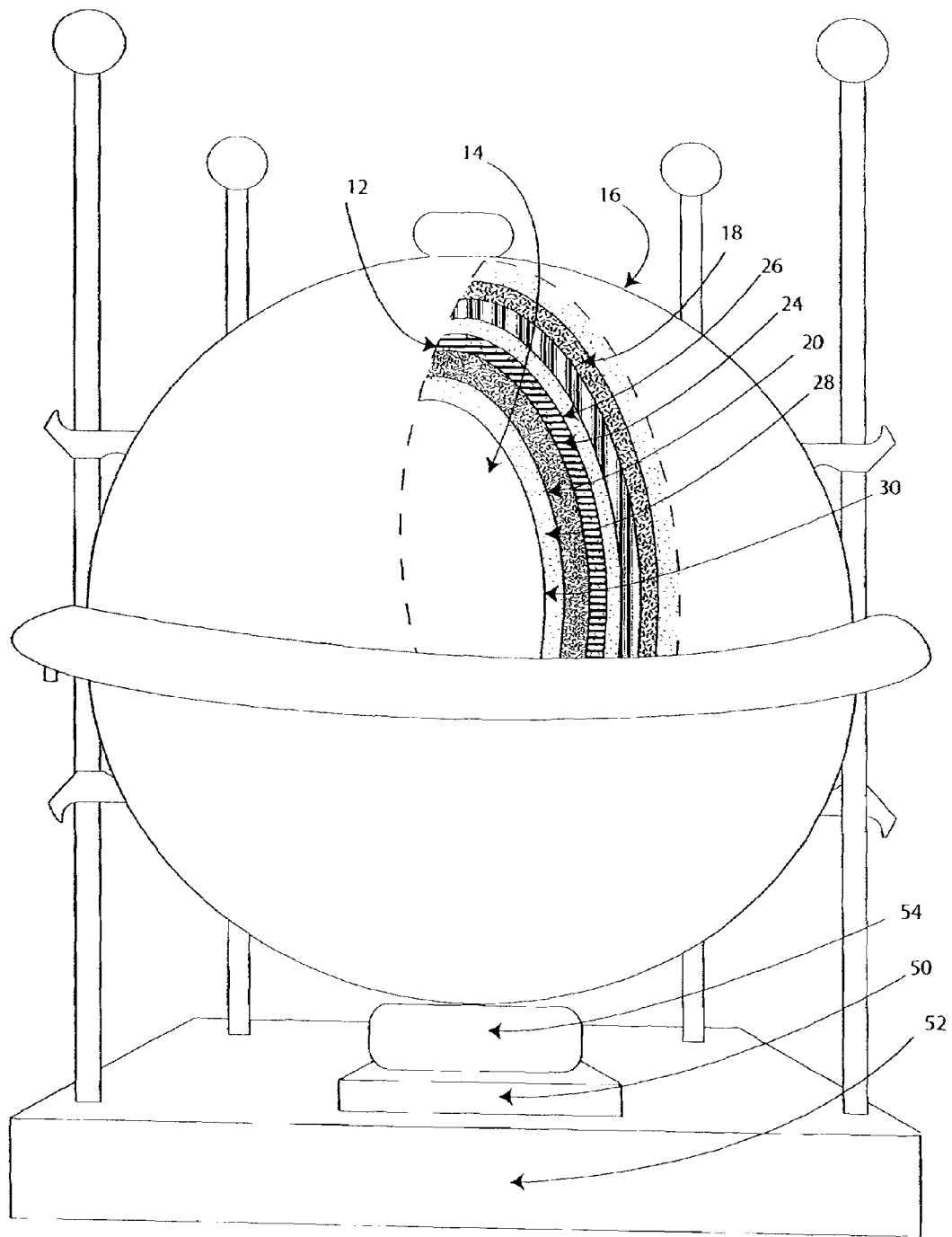
FIG. 1 illustrates an isometric, cutaway view of the present invention.

Referring to the accompanying drawings in which like reference numbers indicate like elements, FIG. 1 illustrates a cutaway view of the Spheric Alignment Mechanism chamber 10 in an exemplary embodiment. The chamber 10 is formed in layers as a series of nested shells 12 which surround the work product 14 at the interior portion of the chamber 10. An outer structural casing 16 forms the exterior surface of the chamber 10. Within the structural casing 16, an electromagnetic shield 18 which surrounds a superconducting shell 20. The superconducting shell 20 is preferably immersed in a cryogenic coolant 22 contained in a reservoir 24. The reservoir 24 is preferably formed by a pair of Dewar flasks 26, 28 on opposite sides of the superconducting shell 20, i.e. the superconducting shell is sealed between the outer Dewar flask 26 and inner Dewar flask 28. The inner Dewar flask 28 is preferably protected by an inner casing 30 around the interior portion of the chamber 10.

Figure 2:
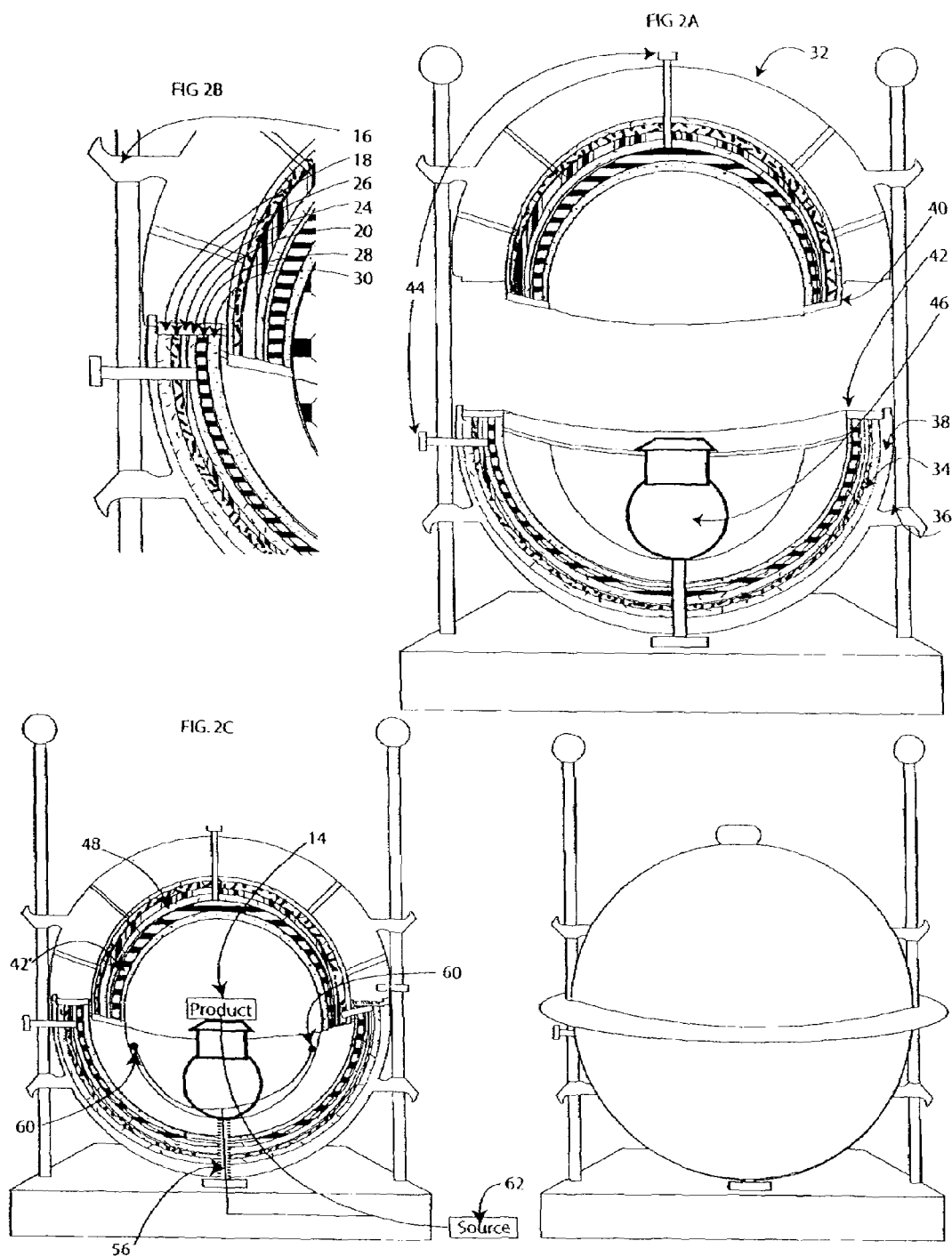
FIGS. 2A, 2B and 2C illustrate cross-sectional views of FIG. 1 chamber.

As illustrated in FIG. 2A, the chamber 10 can be formed from two interconnected hemispheres 32, 34 within a support structure 36. In particular, poles 38 can align the hemispheres 32, 34 while permitting the upper hemisphere 32 to slide relative to the lower hemisphere 34 and holding the lower hemisphere 34 in place. The hemispheres 32, 34 preferably include overlapping sections 40 that are sealed together with a flange 42 that may provide a pressure-seal 42'. A detail view of the chamber's layers 12 in the overlapping section 40 is illustrated in FIG. 2B. Each of the hemispheres 32, 34 preferably has an intake valve 44 through which the cryogenic coolant can be circulated. While the chamber 10 is open, the work product 14 can be set onto a platform 46 or placed directly onto the interior surface.

As illustrated in FIG. 2C, once the chamber 10 is closed, the work product 14 and the interior of the chamber 10 is shielded from outside electromagnetic radiation 48, including electric and magnetic fields and noise. Inside the closed chamber 10, the work product 14 is situated in an entropically isolated environment. In particular, when the chamber 10 is open, the work product 14 within the chamber is at an entropic level approximately equivalent to the ambient environment around the exterior of the chamber 10. However, once the chamber 10 is closed, the interior of the chamber 10, including the work product 14, has a higher entropic stasis level. The electromagnetic shield 18 can be made from any number of materials, including lead, niobium, and metal alloys such as alloys known as MUMETAL and/or METGLAS, as well as combinations of such shielding materials. For example, lead foil and/or niobium backing can be manufactured with or added to the Dewar flasks 26, 28. An interior vacuum or pressurization can be created within the chamber 10 relative to standard atmospheric conditions through a vacuum or pressurization system and sealed by the pressurized flange 42, respectively. The work product table 46 can contain the mechanisms for these systems 46', 46".

Figure 3:
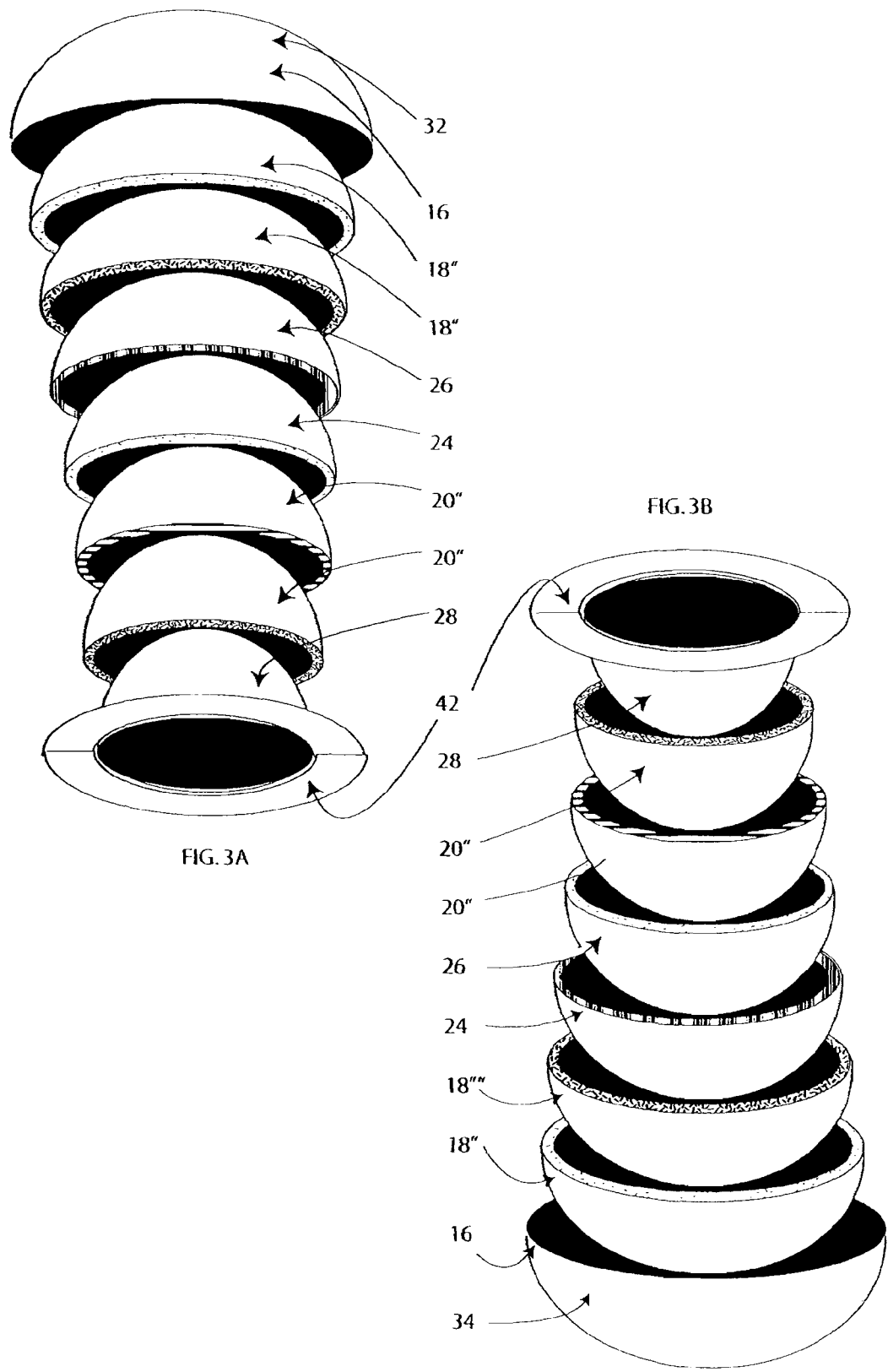
FIGS. 3A and 3B illustrate an exploded view of the chamber of FIG. 1.

An exploded view of the chamber's layers 12 are illustrated in FIGS. 3A and 3B. The superconducting shell may be formed as a solid, continuous shell 20', as overlapping shell sections 20" or any equivalent thereof. It will be appreciated that nested superconducting shells can also be used in the other embodiments of the present invention. As discussed above, it is preferable to completely surround the interior region of the chamber 10 by the superconducting shell 20. The shielding 18 can be made from multiple layers, such as one layer of MUMETAL and/or METGLAS 18' that can be combined with lead foil and/or niobium backing 18".

It will be appreciated that the chamber's interior 10 can be maintained at a pressure and temperature equivalent to the surrounding ambient conditions, and does not need to be cryogenically cooled or evacuated to increase the entropic stasis level within the chamber 10 over that of the ambient environment outside the chamber 10. When a cryogenic coolant is used, the double-Dewar flasks minimize the heat-transfer between the coolant and the interior and exterior of the chamber 10. Examples of cryogenic coolants include liquid nitrogen, liquid hydrogen, liquid helium and solid nitrogen in aluminum foam. It will also be appreciated that any superconductive element can be used in the present invention, including superconductors now known at type-1 and type-2, and their equivalents, including any superconductor that may be made from materials that are superconductive at sea-level standard conditions, i.e., room temperature. For some applications, a single Dewar flask may be used.

Figure 4:
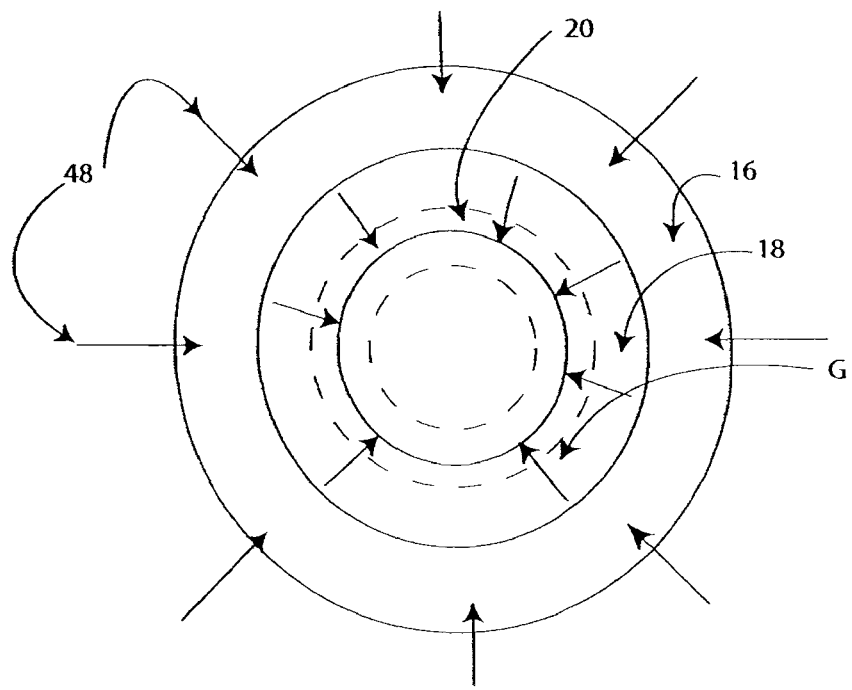
FIG. 4 illustrates a schematic representation of the present invention.

The general schematic arrangement of the chamber is illustrated in FIG. 4, Coulombically represented as a Gaussian surface (G) with a sphere of radius R lying just above the surface of the superconductive shell. The design of the chamber 10 enables electromagnetic field decay in the interior chamber by creating the entropically isolated environment. The equation for electric flux, according Gauss' law, is provided in equation 1 below, where A is the area of the surface and e is the electric field strength just above the surface of the conductor:

$$\Phi_B = eA = \frac{-Q}{\varepsilon_0},$$ [eq. 1]

As discussed above and illustrated in FIG. 4, the interior of the chamber 10 is shielded from the electromagnetic fields 48, and as discussed in more detail below with reference to FIG. 3B, the chamber can include an electromagnetic pulse generator to alter the chamber's internal entropic state.

Figure 5:
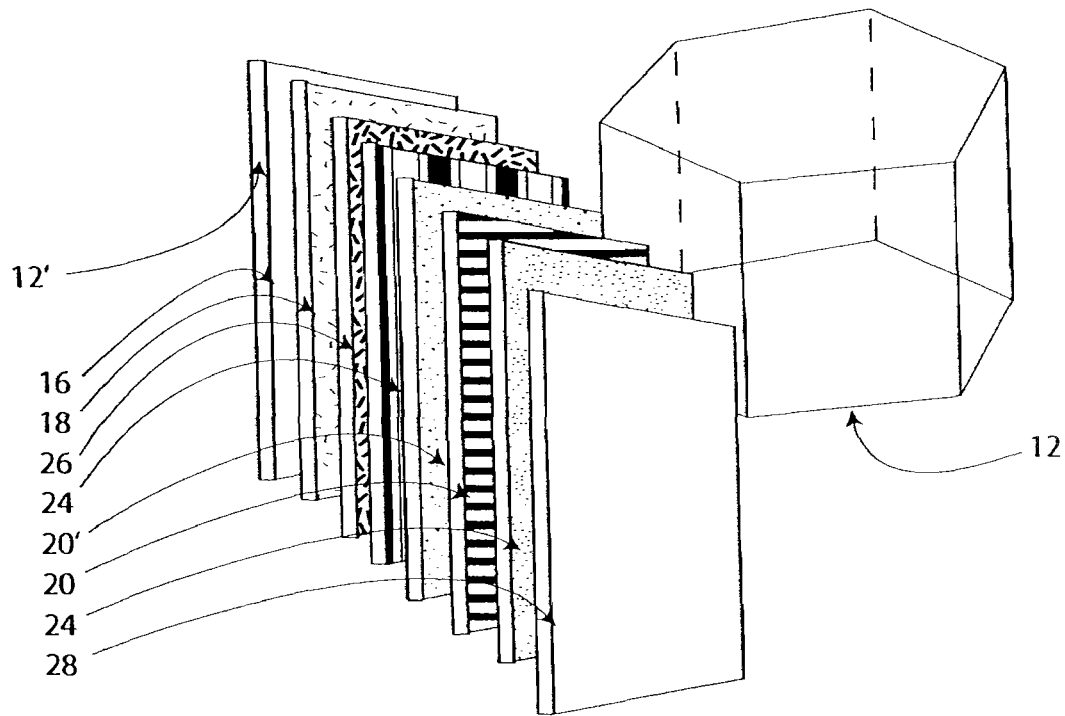
FIG. 5 illustrates an alternative embodiment of the present invention.

It will also be appreciated that the chamber 10 is not limited to being formed in the shape of a sphere and does not necessarily need to be made from a pair of hemispheres 32, 34. The chamber 10 can be formed in any geometric shape and from any number of sections that enclose the work product 14, such as illustrated in FIGS. 5, 6 and 7. As illustrated in FIG. 5, the chamber 10 can be formed by wall sections 12'. Each wall section 12' is formed from a set of nested shells 12 similar to those discussed above with respect to FIGS. 1, 2 and 3. As with the hemisphere shells 12, the wall sections 12' may overlap each other. Generally, the shells 12, 12' surround the work product 14 and permit the entry of the work product 14 into the interior portion of the chamber 10.

As particularly illustrated in FIG. 5, the wall sections 12' can be flat panels with the outer structural casing 16 and electromagnetic shield 18 surrounding the superconducting shell 20. These walls can enclose an operating area, reducing cellular necrosis for a patient with biophysical trauma. In one operating environment, exotic materials such as solid nitrogen and aluminum foam could be used, along with a niobium with METGLAS faced superconducting wall encased within a Dewar that is sealed in insulation and a metal casing.

FIG. 6A illustrates an embodiment in which the chamber 10 is a version of FIG. 1 elongated in the x-axis with shells 12 formed in an ellipsoid shape, and FIG. 7 particularly illustrates an embodiment of the chamber 10 in which the shells 12 are cylindrical and form a sheath 12" around the wire as the work product 14. The ellipsoid device can be used to reduce cellular necrosis resulting from a blunt trauma by placing a person within the chamber, illustrated in FIG. 6B. The chamber can be sized for portability, such as by removing the ends of the chamber, i.e., the ends identified by the dashed lines in FIGS. 6A and 6B. This portable embodiment can be sized as a Spheric Suspension Jacket is an example of a partially enclosed chamber 10 that surrounds the work product, or person, by completely enclosing the patient from the neck to the thighs. The Spheric Suspension Jacket can be used to reduce cellular necrosis for a patient with biophysical trauma in an ambulatory environment. This is accomplished by suspending environmental ambient electromagnetic field interaction on cells in the patient's spinal cord, minimizing cellular necrosis and temporarily stabilizing injury pending transfer into a full pod or suspension surgical theater for advanced trauma care. The sheathed wire device of FIG. 7 can be used to power electronic equipment within any one of the chambers 10.

Within the closed interior chamber 10, the work product 14 can be manipulated between its high entropy stasis and a lower entropy excitation mode. Excitation of the work product 14 and the interior chamber 10 can be performed by introducing electromagnetic and/or kinetic energy into the chamber 10. One example of transmitting kinetic energy into the chamber is a drive 50 that may be housed in the base 52 and which rotates the chamber 10. Another example would be a sound perturbation system 54, which may also be housed at the base 52 or elsewhere around the chamber 10. The sound perturbation system 54 can be tuned to the material frequencies of the work product 14. The amplifier and speaker can be outside the chamber 10, and the sound can be projected into the chamber 10 through a tuned resonant tube 56 and can be directed or otherwise focused to perturb the work product. Preferably, the tuned resonant tube is constructed using materials that enhance resonance and also provide shielding properties, such as METGLAS. Accordingly, the chamber 10 of the present invention eliminates, avoids and/or minimizes electromagnetic radiation during the critical initiating phase of energetic conversion of zero point energy by maintaining a mixed state of low entropy on one and followed immediately by high entropy in the other.

As an example of such kinetic energy manipulation, a yttrium work product 14 can be placed within the open chamber 10. The chamber 10 is closed and sealed, and sound waves of yttrium quantum vibration or associated frequency played from a storage medium are created by the sound perturbation system 54, projected into the chamber 10. For composite materials, the quantum vibrations will be a spectrum based on the composite's component materials, creating and blended to enable harmonic oscillations.

Electromagnetic energy can also be transmitted into the chamber 10 by a number of methods. A wire 58 can connect electromagnetic circuits 60 within the chamber 10 to an energy source 62 outside the chamber 10. Well-known electromagnetic circuits 60 can be used to excite the work product 14, such as a magnetic field generator, an electromagnetic field pulse initiator, a laser, and a light. The wire 58 preferably conducts electricity to the circuits 60 through the base 52. The wire 58 is preferably electromagnetically shielded and enclosed within a superconductive sheath 12" as illustrated in FIG. 7 and the electrodes may be similarly formed. Multiple wires 58 can connect to multiple electrodes and other electromagnetic circuits 60 within the chamber 10. The electromagnetic devices can be situated on the platform 46 or spaced around the interior side of the shells 12. For example, the electromagnetic devices can be spaced at four equidistant points around the hemispheres 32, 34. As yet another example illustrated in FIGS. 8A and 8B, the electromagnetic devices can be spaced at six points.

Figure 8A:
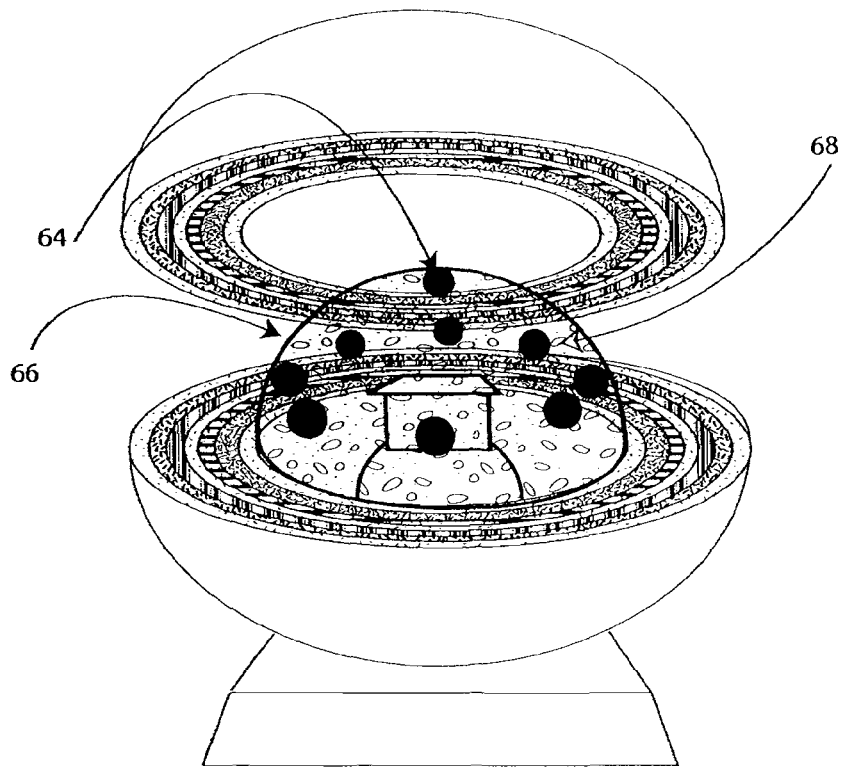
FIGS. 8A and 8B illustrate interior sectional views of the chamber.
Figure 8B:
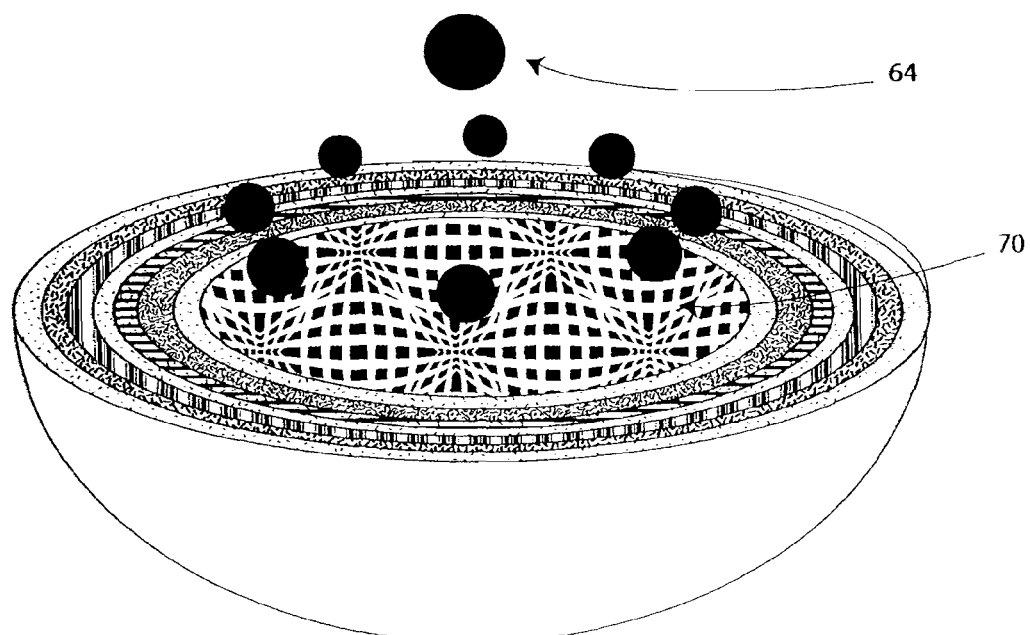

As particularly illustrated in FIGS. 8A and 8B, six point field initiators 64 can be situated in a niobium lattice 66 within the chamber 10, and can be powered by wires 58 entering through the base 52. Without listing all types field initiators, the function of the initiators is to create electromagnetic fields 68 within the chamber such as light, including the visible spectrum and coherent laser light, spark gap, as well as radio through gamma waves. The field pulse is variable, and the electromagnetic fields are used to initiate a low entropy pulse. As discussed in relation to the sound perturbation system 54 above, sound can also be used for high entropy interaction in the atomic and molecular structure of the work product. Additionally, the interior portion of the chamber can be fitted with an anechoic insert 70. A large chamber can use a superconducting quantum interference device (SQuID) to measure the resonant potential of varying molecules in the high entropy chamber and then initiate a harmonic frequency using the pulse driver to realign the molecular structures. The anechoic insert 70, and other similar inserts, can be used to limit external sounds and vibrations from entering the chamber and to facilitate directing sound within the chamber.

A miniaturized, electromagnetically-isolated Bose Einstein optical table can used create new phase forms of matter from condensed states. In this phase form, matter can be additionally perturbed by a mechanical device similar to a diamond anvil pressure type cell, creating the potential for effectively forcing two varying forms of matter together. According to the present invention, it would take significantly less pressure and energy than presently known systems that do not apply pressure and energy in a high entropy environment, such as found inside the chamber 10. For example, according to the Osaka University experiments on superconducting magnetic metals, such as reported in the Journal of Physics: Condensed Matter, Vol. 14, p. 10467-10470 (published Nov. 11, 2002), researchers discovered the onset of superconductivity in the case of iron under pressure. In particular, using electrical resistance measurements, a maximum value of the superconducting transition temperature of 2 K is observed under pressure of 20 GPa. The researchers also reported the phenomenon as it relates to the Meissner effect based on the detection of the diamagnetic signal. According to the present invention, the Osaka University experiments will require significantly less energy and pressure within the high entropy chamber that is created by the electromagnetic shield 18 and the superconducting shell 20 according to the present invention. Therefore, the chamber 10 will also be able to more efficiently create Bose-Einstein condensates and conditional artificial gravity-like fields that are proportional to the force exerted.

Figure 9:
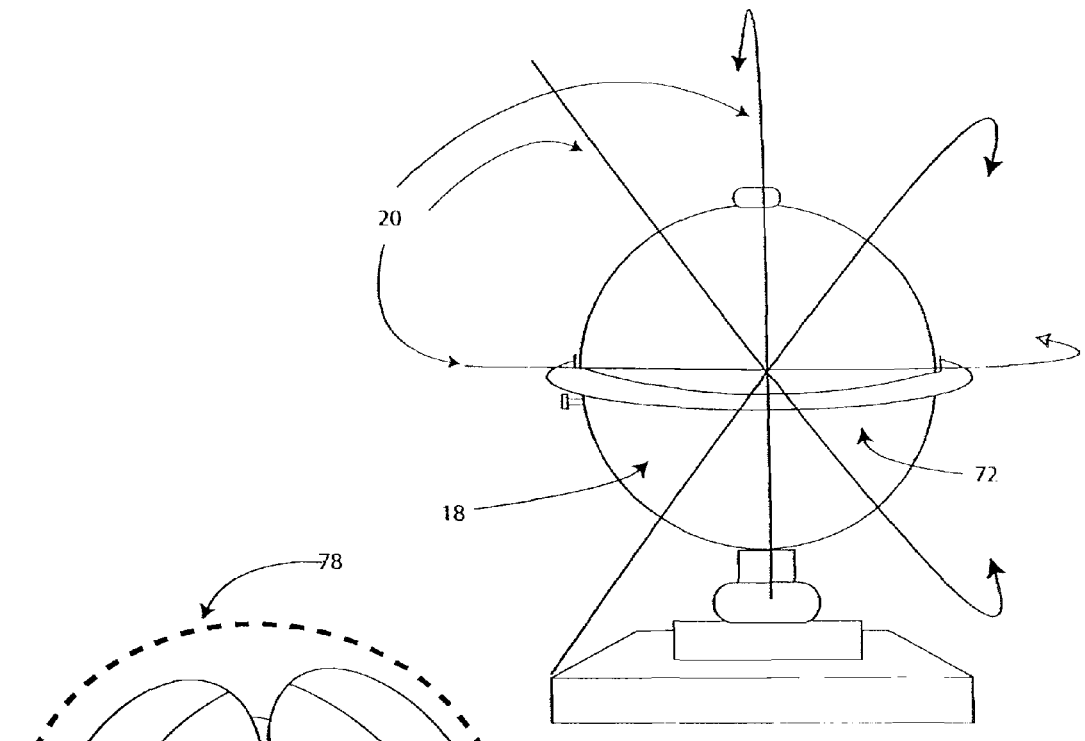
FIG. 9 illustrates a schematic representation of a gyroscopic embodiment.

Multiple superconducting shells 20 can also be nested together in the present invention. For example, the gyroscopic embodiment schematically illustrated in FIG. 9 has four nested superconducting shells 20. As with all of the embodiments, external electromagnetic fields are shielded from the interior of the chamber 10, such as discussed above with regard to the shielding of electromagnetic radiation, electrical fields and magnetic fields by the electromagnetic shield 18. To create the gyroscopic effect, each of the nested shells can have a banded power strip 72 directing electric current in different directions (x+, x−, y+45°, z−45°) emulating the motion of a moving gyroscope. The electrical signals can be established in each of the spheres through individual initiating switches or by computer program that controls the flow of electricity through each sphere.

A given gyroscope moment G will always result in the same ratio of energy to frequency. Another example is an electron in an external magnetic field. The electron has a gyroscopic moment and a magnetic field. An electron has electromagnetic radiative losses and operates in a linear external magnetic field that serves to invert it. However, gyroscopic math is identical with the electron's gyroscopic moment being $\hbar/2$. In equation 2 below, E is energy, v is precession of the primary axis, G is the gyroscopic moment and $\hbar$ being Planck's constant.

$$E/v = 2.G \quad \text{[eq. 2]}$$
$$= 2.(h/2),$$
$$= h$$

Planck's constant, owing nothing to the electromagnetic world, is a purely gyroscopic property. The concept that the electron spin is ½ is related to its gyroscopic moment being h/2. In an additional embodiment with room-temperature superconductors, it could also be possible to physically rotated each of the spheres. With room-temperature superconductors, it could also be possible to physically rotate each of the spheres.

Four different superconducting walls can be used with the present invention. The four superconducting walls have independent rotation each be manipulated through a spinning mass, such as a disk/wheel, mounted on the base so that its axis can turn freely in one or more directions and thereby maintain its orientation regardless of any movement of the base motor and shaft. Electromagnetic energy can also be directed across the surface of the four different, spatially-separated spheres in different directions enabling a stationary electromagnetic gyroscope. For embodiments in which the nested shells 12 includes the coolant reservoir 24, electromagnetic fields, lasers or visible light, invisible light including all waveforms from radio to gamma, magnetic fields or a combination thereof may also be used.

Figure 10:
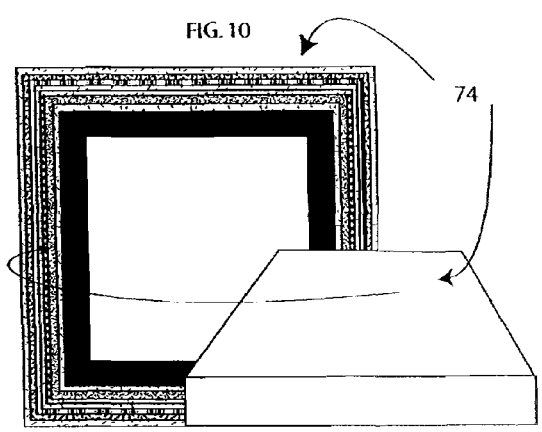
Figure 12:
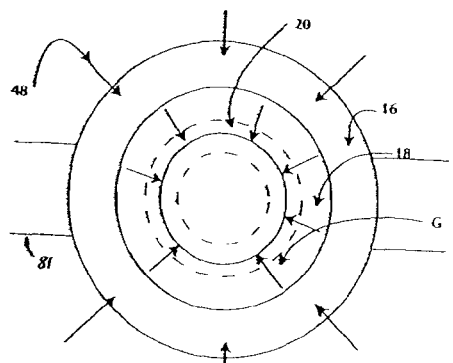
FIG. 12 illustrates a schematic of a single chamber with bridge attachment.

From the above description and the corresponding illustrations, it will be appreciated that the present invention uses the superconducting fields to alter the zero point energy system within the chamber 10. As such, the chamber 10 serves as a catalyst for increasing the efficiency in manipulating materials through the transfer of energy. In particular, within the closed chamber, the strong and weak force on atomic volume of the work product 14 are at a lower order configuration and confirmation, and the work product can then be perturbed/excited by the electromagnetic and/or kinetic energy fields to enable higher order manipulation of the work product's atomic and molecular structures. Additionally, the chamber 10 can be formed in different shapes and sizes. For example, the chamber illustrated in FIG. 5 can be large enough to enclose people, equipment and other structures and the chamber illustrated in FIG. 6 can be small enough to be portable. The chamber 10 can be used for altering atoms a work product 14, which can range from inanimate materials and objects to biophysical organisms and even human patients. Accordingly, the chamber can be used in life sciences to minimize cellular necrosis caused by blunt force trauma. The chamber raises overall entropy of the patient's atomic and molecular structures, allowing for localized medical intervention with minimal damage to systemic tissues. Therefore, the chamber could also be used as an operating room for surgical intervention to minimize damage to systemic tissues. The chamber can be used in manufacturing to alter material properties of chemicals, pharmaceuticals, superconductors, effecting molecular configuration and confirmation. Various geometric shapes can be used to accomplish the same electromagnetic isolated environment. For example, FIG. 10 illustrates electronic equipment 74 with a casing 10 designed according to the present invention.

Figure 11:
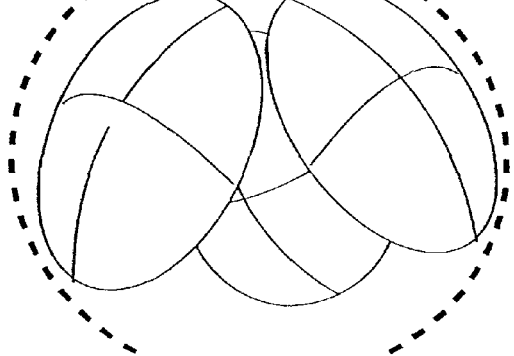
FIGS. 10 and 11 illustrate alternative embodiments of the present invention.

There is electromagnetic shielding uniformly around the device regardless of its geometry; be it a parabola, triangle, cube, tube or other geometric shape. As evident from the various embodiments illustrated, different geometric shapes can be utilized to accomplish the same electromagnetic isolated environment. For example, as particularly illustrated in FIG. 11, a chamber 10 is created by parabolic-focused sections 76 within an electromagnetically isolated environment 78. One example of such an electromagnetically isolated environment 78 would be a room designed to completely shield outside electromagnetic fields from entering the interior chamber. Each of the six concave superconducting surfaces 76 focus on a center point area that contains the work product. From this embodiment of the present invention, it will be appreciated that within the electromagnetically isolated environment 78, the chamber 10 can surround the work product with a partial enclosure.

Generally, within the closed chamber, a low ordered high entropy stasis field is maintained, and the amount of internal energy to perturb atomic spherics strong and or weak force is minimal. Accordingly, the forces necessary to perturb atoms or molecules of the work product 14 within stasis fields of the closed chamber 10 are proportionately low compared to the forces necessary outside of the chamber. The present invention permits the formation of new molecular structures, stronger molecular bonds on existing elements, alterations in stable atomic structures and neutralization of radiation, and even the creation of new forms of matter and gravitational probability waves from existing Bose Einstein Condensates.

Figure 13:
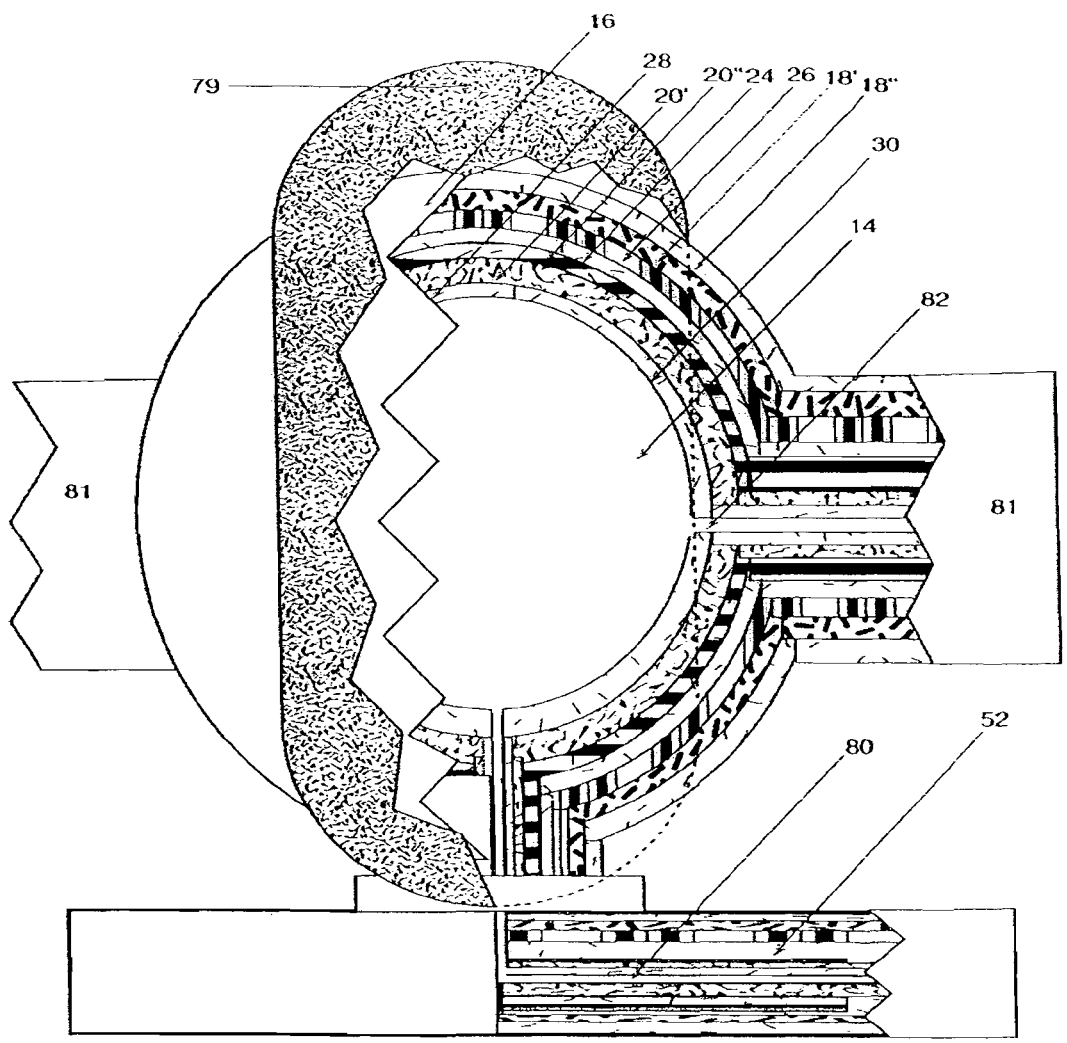
FIG. 13 illustrates cross-section view of a single chamber of FIGS. 14 and 15.

FIG. 13 is a schematic cross section of one chamber used concurrently in a series of interconnecting chambers for both the ESD (Entropic Step Down) embodiment and the EPS (Entropic Perturbation System) embodiment. The chamber is formed in layers as a series of nested shells that surround the work product 14 at the interior portion of the chamber. An outer structural casing 16 forms the exterior surface of the chamber. Within the structural casing 16, an electromagnetic shield 18 which surrounds a superconducting shell 20. The superconducting shell 20 is preferably immersed in a cryogenic coolant 22 contained in a reservoir 24. The reservoir 24 is preferably formed by a pair of Dewar flasks 26, 28 on opposite sides of the superconducting shell 20, i.e. the superconducting shell is sealed between the outer Dewar flask 26 and inner Dewar flask 28. The inner Dewar flask 28 is preferably protected by an inner casing 30 around the interior portion of the chamber 10. A cutaway view of a torus 79 completely surrounds the sphere housing sound mechanism for transfer into the chamber 88 to facilitate kinetic manipulation of the work product. The bridge 81 and the base 52, constructed of nested superconducting shells, are used to interconnect a series of chambers that collectively mediate space time effects associated with molecular van der Waals and electromagnetic fields to maintain the isolated electromagnetic environment bringing the work product to its ground state boundary conditions across the system. The spherical shell closed cavity resonator and potential Casimir force directed away from its center is explored in QFT Limit of the Casimir Force, article by Marco Scandurra. The base 52 is the portal for the introduction of work product through an isolated channel 80 that enters the base of the chamber. The torus 79 houses interchangeable multi-frequency sound drivers, infrasound through white noise to ultrasound, that wrap around the chamber focusing sound perturbations on the work product in the chamber interior 14. As presented in the article entitled "Large-Scale Surveys and Cosmic Structure" by J. A. Peacock: "The cosmological horizon at matter-radiation equality also enters in the properties of the baryon component. Since the sound speed is of order c, the largest scales that can undergo a single acoustic oscillation are of order the horizon. The transfer function for a pure baryon universe shows large modulations, reflecting the number of oscillations that have been completed before the universe becomes matter dominated and the pressure support drops. The lack of such large modulations in real data is one of the most generic reasons for believing in collisionless dark matter. Acoustic oscillations persist even when baryons are subdominant, however, and can be detectable as lower level modulations in the transfer function." The use of focused sound is also generally discussed in the article "The Force Of Acoustics" published on Dec. 4, 1998 by PhysicsWeb. Electromagnetically shielded driver energy is from an outside power source.

FIG. 14a is an aerial down drawing and FIG. 14b is a schematic representation of the SAM ESD Entropic Step Down power generation system. The ESD is constructed of a series of shells 83, 85, 86, 87, 88 all built to the superconducting nested shell specifications in the schematic of FIG. 13 and evidenced in FIGS. 14c and 14d. The torus 79 can be used on one or across a series of chambers, 83, 84, 85, 86, 87 and 88 (see FIGS. 14a, 14b, 15b and 15c). In FIG. 14d an additional torus 92 is used in tandem with torus 79, this combination can also be used across any chamber or multiples. Each chamber can be tuned to resonate at a specific frequency, see dotted line torus FIG. 15b. For example, chamber 83 is tuned to resonate with the vibration frequency emitted by its torus 79 to excite hydrogen, while chamber 84 is tuned to resonate alternating excitation frequencies of hydrogen/helium and chamber 87 is tuned to resonate frequency of helium (see also "Seeing Sound Waves in the Early Universe" article by Arthur Kosowsky and "Spinodal Instability in the Quark-Gluon Plasma" article by C. E. Aguiar, E. S. Fraga, and T. Kodama). Zero point energy ZPE release in 87's "electromagnetic vacuum" chamber enables single wave matter state potential. According to the "Vacuum Energy" article by M. D. Roberts: "Larraza and Denardo (1998) present theoretical and experimental results for the force law between two rigid, parallel plates due to the radiation pressure of band-limited acoustic noise. They claim excellent agreement is shown between theory and experiment. While these results constitute an acoustic analog for the Casimir effect, an important difference is that the band-limited noise can cause the force to be attractive or repulsive as a function of the distance of separation of the plates. Applications of the acoustic Casimir effect to background noise transduction and non-resonant acoustic levitation are suggested."

Figure 16:
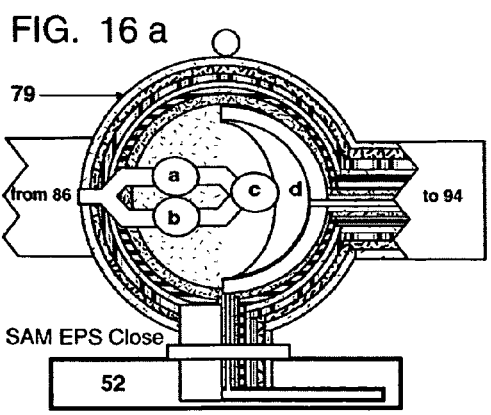
FIG. 16 illustrates a wave cancellation apparatus for the present invention.
Figure 16:
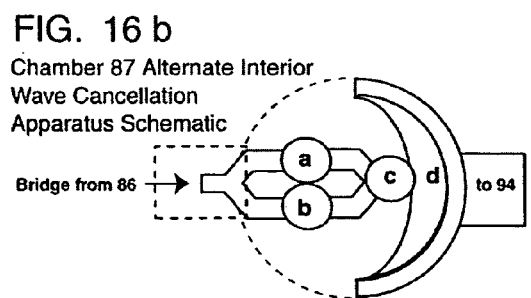

The energy driver of FIG. 14a begins with ZPE chamber 87. In chamber 88, the work product is divided into wave cancellation apparatus 100 consisting of two interior acoustically separated spherical chambers 100a, 100b (see FIG. 16). In FIG. 16, interior chamber 100a work product resonates at the frequency of helium, and chamber 100b work product resonates at variable time reversal of chamber 100a work product from 180° out of phase to "in phase" with work product of 100a (see "An Overview of Time-Reversal Acoustic Communications" article by G. F. Edelmann and "The Phased Array Technology-Application to Time-Reversal in Acoustics" article by D. Cassereau, M. Fink). In FIG. 16, the plasma audio driven wave state is kinetically moved into interior chamber 100c that intermixes wave state work product of 100a and 100b facilitating specific phase cancellation of the excited helium plasma single wave state into wave packets facilitating controlled distribution into compartment 100d. From 100d, the work product is kinetically driven into superconductor shielded routers tubes each with its own phase reversed helium resonant frequency audio driver that streams the notched plasma wave "packets" into multiple specifically tuned electromagnetic field amplifiers with poloidal containment fields 89 where wave packets are converted from zero point to electromagnetic energy in small mix resonant tuned fail-safe chamber 91 before final distribution to a conversion turbine driver system graphically represented by 90 (see "Electron Acceleration by a Plasma Wave in a Sheared Magnetic Field" article by K. P. Singh, V. L. Gupta, Lalita Bhasin and V. K. Tripathi). In another embodiment a superconducting stellarator, or a tokomak, or any magnetic poloidal confinement device of sufficient strength for ZPE transition and containment of electromagnetism could augment or replace the nuclear magnetic resonator 89, 94, 95, 96, 97 as shown in FIGS. 14b and 15b.

Force balance between internal zero point energy forces under kinetic pressure and the forces of the nuclear magnetic resonator is studied using magnetohydrodynamics. Balancing forces of kinetic pressure with magnetic field realizes $$c\Delta p = J \times B \quad [eq.3]$$

J in this case is the ZPE density of the work product in the chamber, B is total magnetic field and p is kinetic pressure on work product, c is speed of light. While the equation needs to be solved numerically within certain limits it is possible to obtain analytical results. The nuclear magnetic resonators (NMR) 89, 94, 95, 96, 97 in conjunction with the bridge 81 functions similar to a tokomak with a rotational symmetry and each cross section through this symmetry axis are identical making the equilibria (balancing forces of kinetic pressure with magnetic field) basically 2 dimensional. The magnetic field is stronger inside the NMR torus and varies roughly l/R where R is the distance from a point in the work product in the bridge 81 to the NMR torus with poloidal field coils for work product placement and shaping facilitating constant magnetohydrodynamic process across the length of the resonators 89, 94, 95, 96, 97. Electromagnetically shielded field driver energy is from an outside power source.

Figure 14:
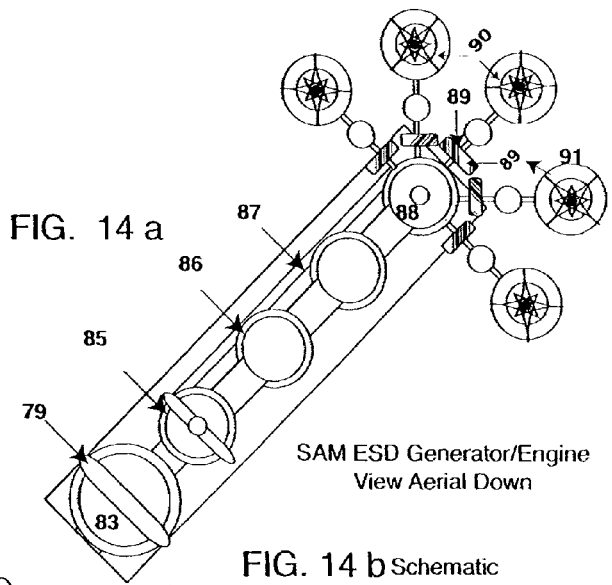
FIG. 14 illustrates an alternate embodiment of the present invention called ESD.
Figure 14:
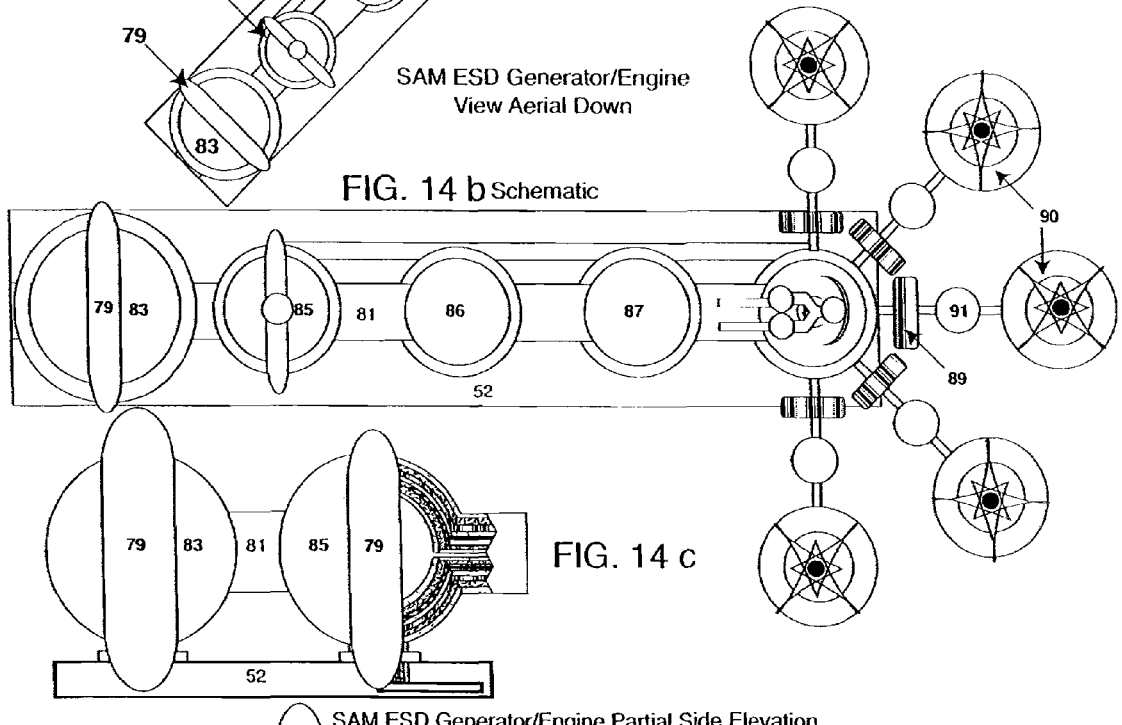
Figure 14:
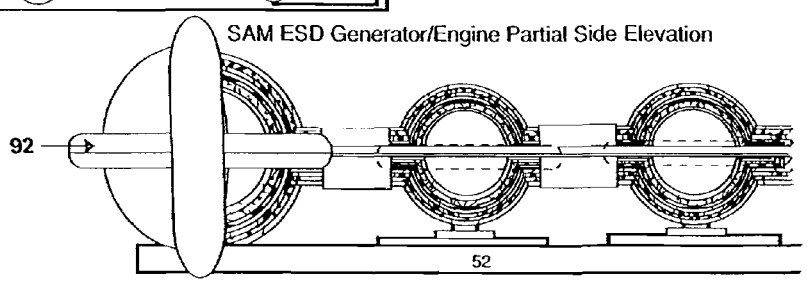

FIGS. 15b and 15c illustrate the SAM EPS Entropic Perturbation System and utilize the same basic structure of chamber 10, torus sound application 79, base 52 and bridge 81 found in FIG. 14. The single wave state moves into a series of graduated (0 to 100%) narrow beam focused electromagnetic field amplifiers 94, 95, 96 and 97 facilitating zero point energy conversion to electromagnetic energy across the complete single wave state for the purposes of propulsion through an electromagnetically controlled nozzle 98 yielding an energy potential on the scale of a magnetic flux tube (see "Dynamic and Stagnating Plasma Flow Leading to Magnetic Flux Tube Collimation" article by S. You, G. Yun, and P. M. Bellan). The central bridge 81 runs on a central axis core of the electromagnetic field amplifiers 94, 95, 96 and 97 graduating superconducting entropy from (100%-0) across electromagnetic field amplifiers evident in the dotted line cutaway reveal of 94, 95 and 96. An alternate embodiment for ESP propulsion would incorporate the wave packet division in chamber 87 that is divided into two interior acoustically separated spherical chambers in 87. The first interior chamber resonates at the frequency of helium, and chamber two resonates at a time reversal of helium that enables a multiple wave packet matter streams for variable controlled thrust.

The description of the invention is merely exemplary in nature and, thus, variations that do not depart from the gist of the invention are intended to be within the scope of the invention. From the description of the embodiments above, it will be appreciated that sound is the preferred perturbator of the work product, but other types of kinetic energy and even energy can be used to manipulate the work product. As examples of these alternative manipulators, pressure, light and electromagnetic energy are particularly discussed.

Regardless of the type of energy that is used within the chamber 10 on the work product, the interior of the chamber 10 is electromagnetically shielded from its ambient environment. Therefore, all electrical input into the chamber 10 enters through a electromagnetically shielded superconducting wire and does not introduce any electromagnetic fields into the ambient state absent the controlled perturbation of the work product within the chamber. Accordingly, such variations are not to be regarded as a departure from the spirit and scope of the invention.

What is claimed is:

1. A chamber for reducing strong force bonds in a work product, comprising:
   an electromagnetic shield positioned around the work product, wherein said electromagnetic shield is substantially impervious to electromagnetic radiation, electrical fields and magnetic fields;
   a plurality of superconducting shells spaced apart and situated within said electromagnetic shield and surrounding the work product; and
   at least one bridge cooperatively connecting said superconducting shells, wherein the work product can move between said superconducting shells through said bridge.

2. The chamber set forth in claim 1, wherein said electromagnetic shield is selected from the group of materials consisting of lead, niobium, a metal alloy, and any combination thereof, and wherein said superconducting shell is selected from the group of superconducting walls consisting of a plurality of overlapping superconductive elements, a continuous superconductive element, and a pair of opposing, interconnected superconductive halves.

3. The chamber set forth in claim 1, wherein said plurality of superconducting shells is comprised of a pair of interconnected hemispheres and a flange therebetween enabling a vacuum environment potential.

4. The chamber set forth in claim 3, wherein at least one of said pair of interconnected hemispheres overlaps the other of said pair of interconnected hemispheres and wherein said flange provides a pressure seal.

5. The chamber set forth in claim 1, further comprising a sound perturbation system in operative communication with the work product in said plurality of superconducting shells.

6. The chamber set forth in claim 1, further comprising a base to which said electromagnetic shield is mounted, said base being situated outside an exterior of said electromagnetic shield and said plurality of superconducting shells.

7. The chamber set forth in claim 1, further comprising a means for transferring energy into the chamber.

8. The chamber set forth in claim 1, further comprising a pair of Dewar flasks on opposite sides of a superconducting shell, at least one coolant within said pair of Dewar flasks and a coolant intake valve, wherein said pair of Dewar flasks form a reservoir containing said coolant and said superconducting shell, wherein said coolant intake valve is in fluid communication with said reservoir, wherein said coolant is a cryogenic fluid and wherein said cryogenic fluid contacts said opposite sides of said superconducting shell with said reservoir.

9. A series of chambers for reducing strong force bonds in a work product, comprising:
   a means for shielding the work product from electromagnetic radiation, electrical fields and magnetic fields;
   a superconducting shell surrounding the work product wherein said superconducting shell has an open position and a closed position;
   a means for transferring energy into the chambers; and
   a series of bridges between the chambers, wherein said bridges are comprised of superconducting nested shells maintaining entropy across the isolated system.

10. The series of chambers set forth in claim 9, further comprising a base underlying the chambers, wherein the work product is pressure induced into the system through said base and said base is comprised of superconducting nested shells.

11. The series of chambers set forth in claim 9 wherein space time effects of van der Waals electromagnetic fields on atomic structures, molecular structures and work product structures are altered to their lowest ground state.

12. The series of chambers set forth in claim 11 wherein sound is utilized to perturbate the work product facilitating non-electromagnetic excitation enabling release of zero point energy in the chambers.

13. The series of chambers set forth in claim 9 wherein a low electromagnetic ground state and its associated zero point energy is raised to its highest excitable electromagnetic state through a bank of powerful electromagnetic field poloidal containment amplifiers facilitating energy generation for power usage or propulsion and motive direction.

14. A series of chambers for reducing strong force bonds in a work product, comprising:
   a first superconducting shell;
   a second superconducting shell spaced apart from said first superconducting shell; and
   a bridge cooperatively connecting said first superconducting shell and said second superconducting shell, wherein the work product can move between said first and second superconducting shells through said bridge.

15. The series of chambers set forth in claim 14, further comprising a series of bridges between the chambers, wherein said bridges are comprised of superconducting nested shells maintaining entropy across the isolated system.

16. The series of chambers set forth in claim 14, further comprising a base underlying the chambers, wherein the work product is pressure induced into the system through said base and said base is comprised of superconducting nested shells.

17. The series of chambers set forth in claim 14 wherein space time effects of van der Waals electromagnetic fields on atomic structures, molecular structures and work product structures are altered to their lowest ground state.

18. The series of chambers set forth in claim 17 wherein sound is utilized to perturbate the work product facilitating non-electromagnetic excitation enabling release of zero point energy in the chambers.

19. The series of chambers set forth in claim 14 wherein a low electromagnetic ground state and its associated zero point energy is raised to its highest excitable electromagnetic state through a bank of powerful electromagnetic field poloidal containment amplifiers facilitating energy generation for power usage or propulsion and motive direction.

20. A series of chambers for reducing strong force bonds in a work product, comprising:
   a means for shielding the work product from electromagnetic radiation, electrical fields and magnetic fields;
   a superconducting shell surrounding the work product wherein said superconducting shell has an open position and a closed position;
   a means for transferring energy into the chambers; and
   a base underlying the chambers, wherein the work product is pressure induced into the system through said base and said base is comprised of superconducting nested shells.

21. A series of chambers for reducing strong force bonds in a work product, comprising:
- a means for shielding the work product from electromagnetic radiation, electrical fields and magnetic fields;
- a superconducting shell surrounding the work product wherein said superconducting shell has an open position and a closed position; and
- a means for transferring energy into the chambers,
- wherein space time effects of van der Waals electromagnetic fields on atomic structures, molecular structures and work product structures are altered to their lowest ground state.

22. A series of chambers for reducing strong force bonds in a work product, comprising:
- a means for shielding the work product from electromagnetic radiation, electrical fields and magnetic fields;
- a superconducting shell surrounding the work product wherein said superconducting shell has an open position and a closed position; and
- a means for transferring energy into the chambers,
- wherein a low electromagnetic ground state and its associated zero point energy is raised to its highest excitable electromagnetic state through a bank of powerful electromagnetic field poloidal containment amplifiers facilitating energy generation for power usage or propulsion and motive direction.

* * * * *